(12) United States Patent
Peterson et al.

(10) Patent No.: US 11,412,619 B2
(45) Date of Patent: *Aug. 9, 2022

(54) INTEGRATED FLEXIBLE PRINTED CIRCUIT WITH ROUTING CHANNEL/AID

(71) Applicant: APTIV TECHNOLOGIES LIMITED, St. Michael (BB)

(72) Inventors: David R. Peterson, Aurora, OH (US); Joseph Sudik, Jr., Niles, OH (US); Jared Bilas, North Bloomfield, OH (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 17/120,425

(22) Filed: Dec. 14, 2020

(65) Prior Publication Data

US 2021/0227694 A1 Jul. 22, 2021

Related U.S. Application Data

(60) Provisional application No. 62/962,621, filed on Jan. 17, 2020.

(51) Int. Cl.
| | |
|---|---|
| *H05K 1/18* | (2006.01) |
| *H05K 1/02* | (2006.01) |
| *H05K 3/00* | (2006.01) |

(52) U.S. Cl.
CPC .............. *H05K 1/189* (2013.01); *H05K 1/028* (2013.01); *H05K 3/0058* (2013.01); *H05K 2201/056* (2013.01); *H05K 2201/09036* (2013.01); *H05K 2201/09063* (2013.01); *H05K 2201/09236* (2013.01); *H05K 2201/10356* (2013.01); *H05K 2201/2072* (2013.01)

(58) Field of Classification Search
CPC ........ H05K 1/189; H05K 1/028; H05K 1/118; H05K 3/0058; H05K 2201/09236; H05K 2201/09036; H05K 2201/056; H05K 2201/09063; H05K 2201/10356; H05K 2201/2072

See application file for complete search history.

(56) References Cited

U.S. PATENT DOCUMENTS

| | | | | |
|---|---|---|---|---|
| 4,394,707 A | * | 7/1983 | Consoli | H05K 1/189 361/736 |
| 6,770,813 B1 | * | 8/2004 | Ramsagar | B60R 16/0207 174/525 |

(Continued)

*Primary Examiner* — Roshn K Varghese
(74) *Attorney, Agent, or Firm* — RMCK Law Group, PLC

(57) ABSTRACT

A flexible circuit (FC) comprises a primary dielectric layer having a plurality of substantially parallel conductive circuit traces disposed therein and a secondary dielectric layer extending from or attached to the primary dielectric layer, wherein the secondary dielectric layer does not have any conductive circuit traces disposed therein, and wherein at least one of the primary and secondary dielectric layers defines an alignment feature for wrapping and securing the FC about a central structure. A method of wrapping and securing the FC about a central stricture comprises wrapping the FC about the central structure while aligning each alignment feature with a respective complimentary alignment feature such that the FC fully encompasses the central structure and is secured thereabout.

19 Claims, 7 Drawing Sheets

(56) References Cited

U.S. PATENT DOCUMENTS

| | | | |
|---|---|---|---|
| 6,827,316 B1 * | 12/2004 | Arai | B60R 16/0215 24/16 PB |
| 7,265,533 B2 * | 9/2007 | Lightbody | G01R 15/142 324/126 |
| 2002/0079129 A1 * | 6/2002 | Klesing | B60R 16/0215 174/117 F |

* cited by examiner

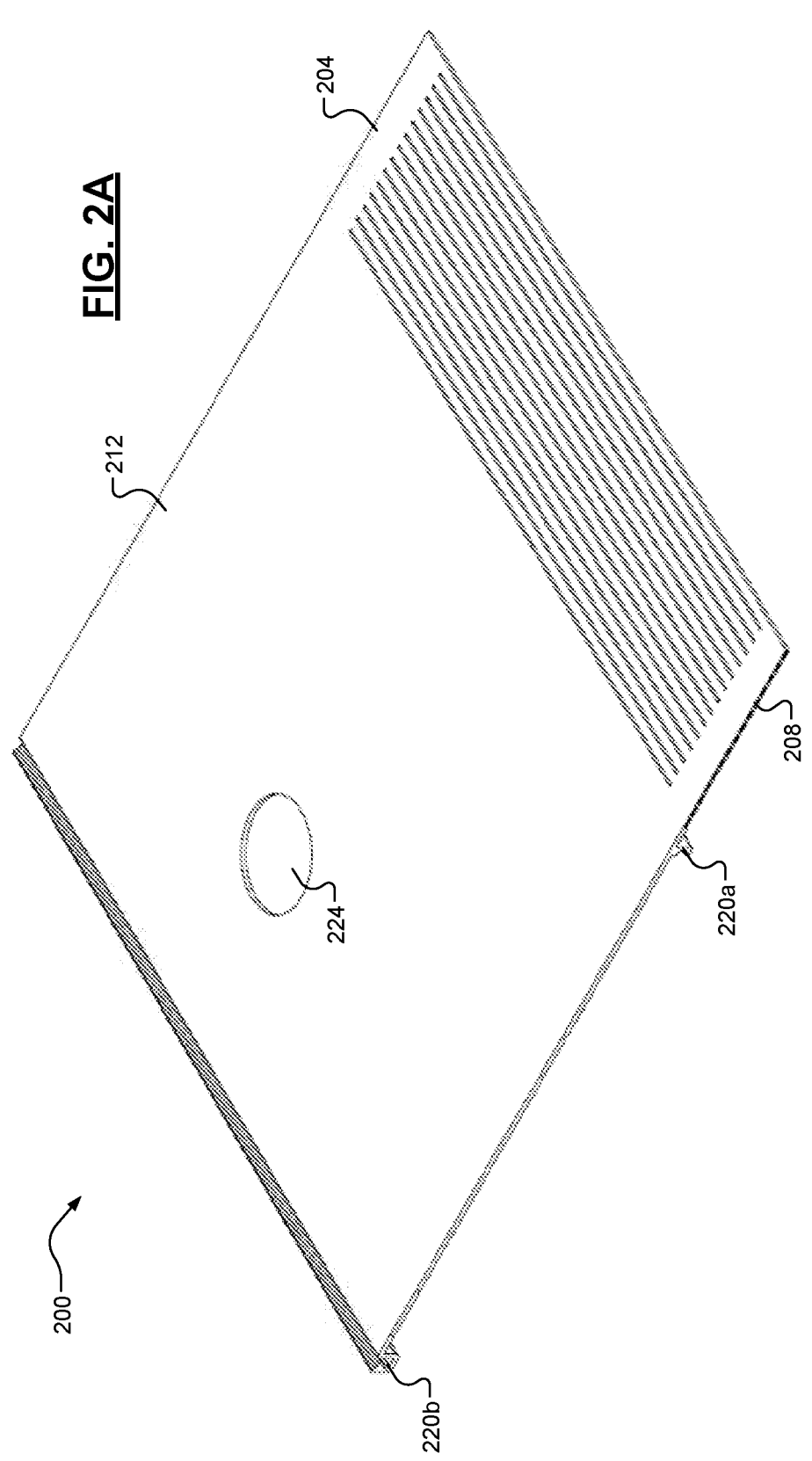

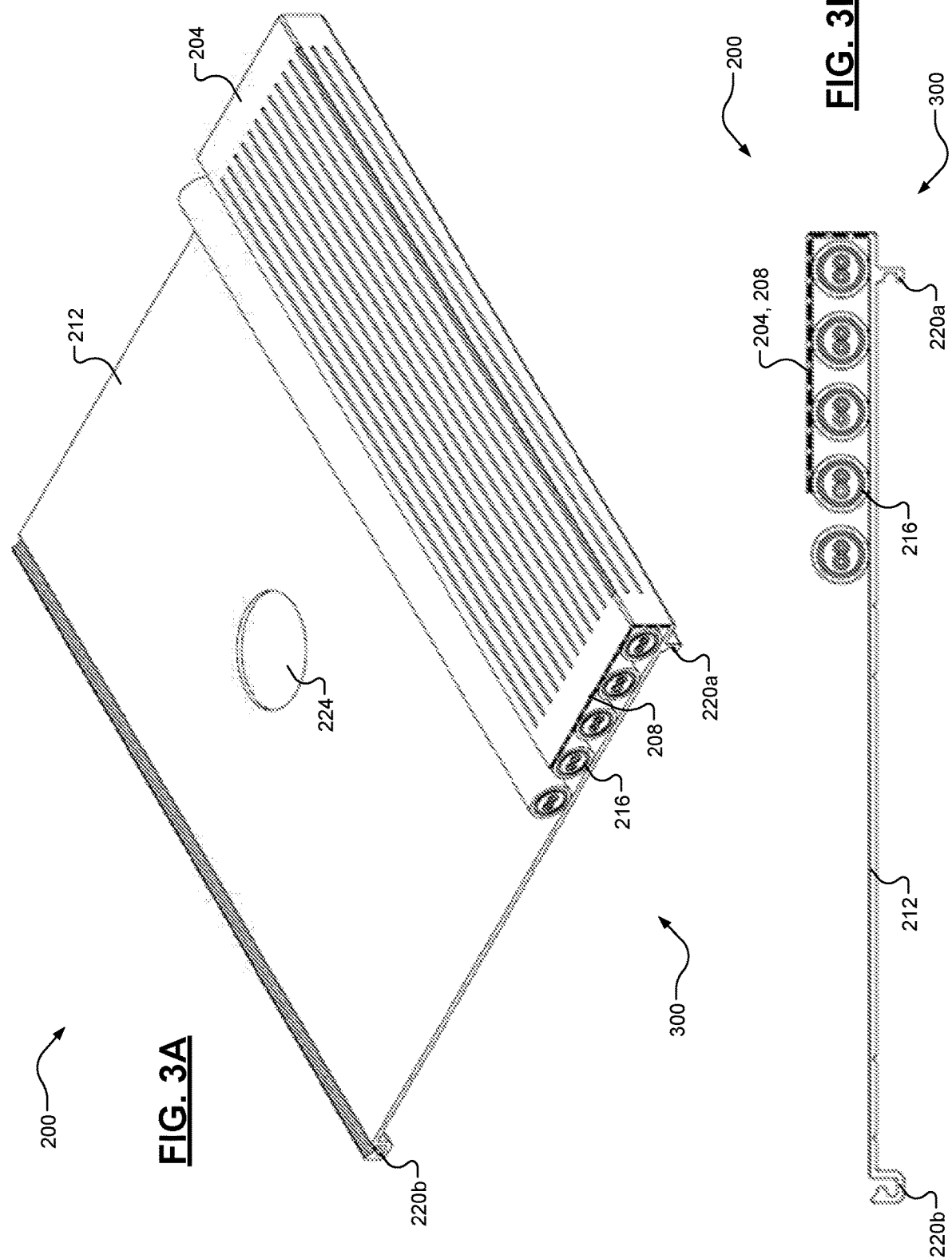

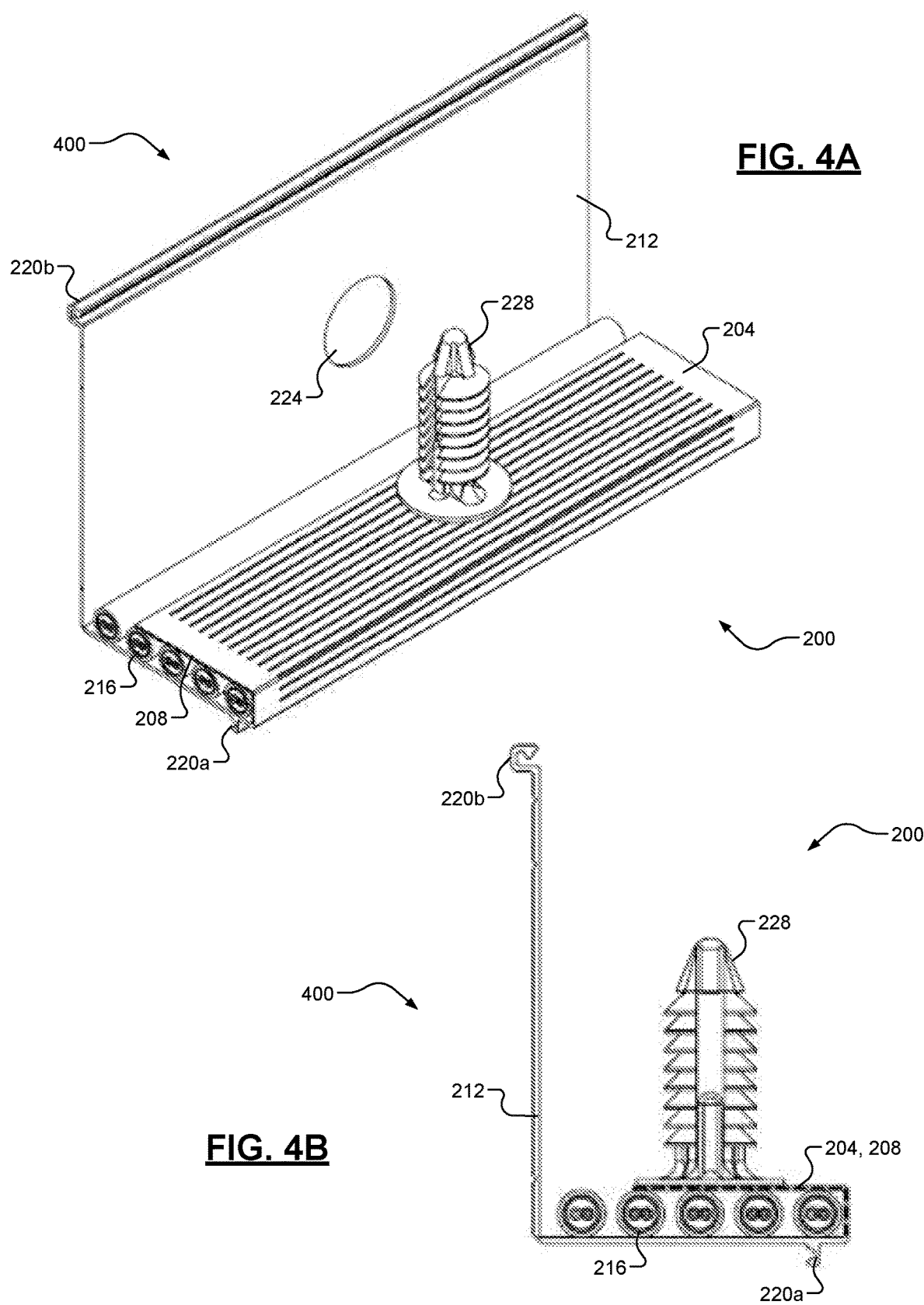

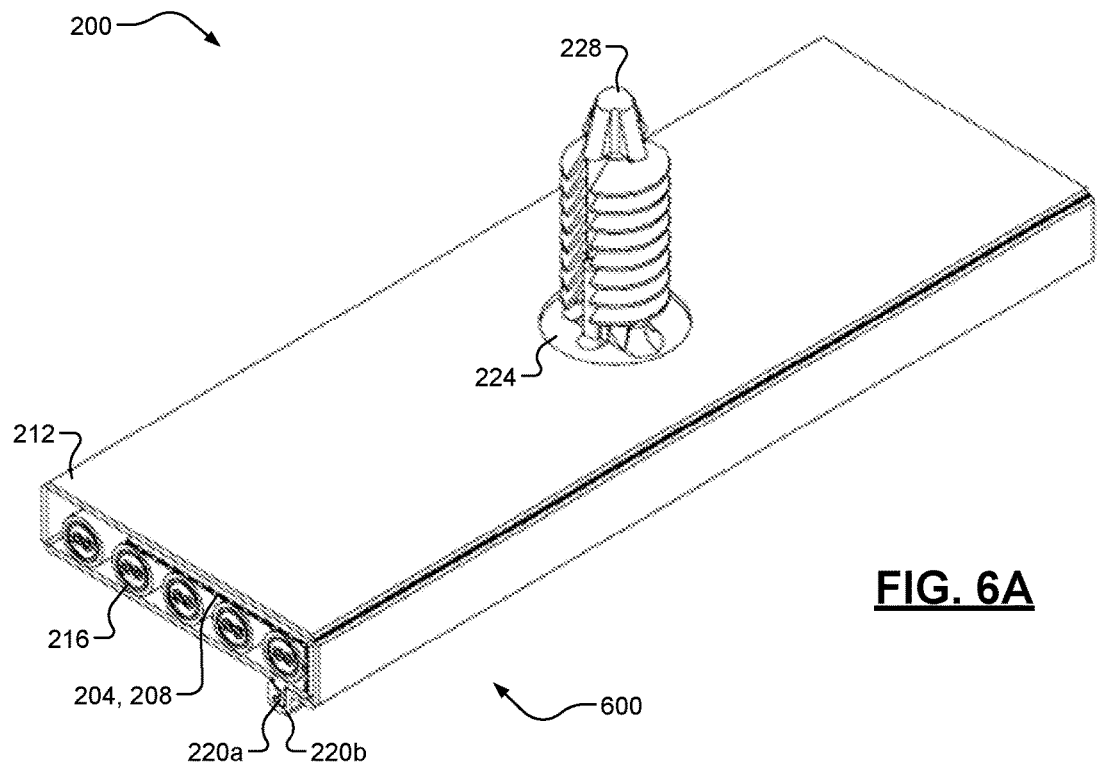
FIG. 6A
FIG. 6B
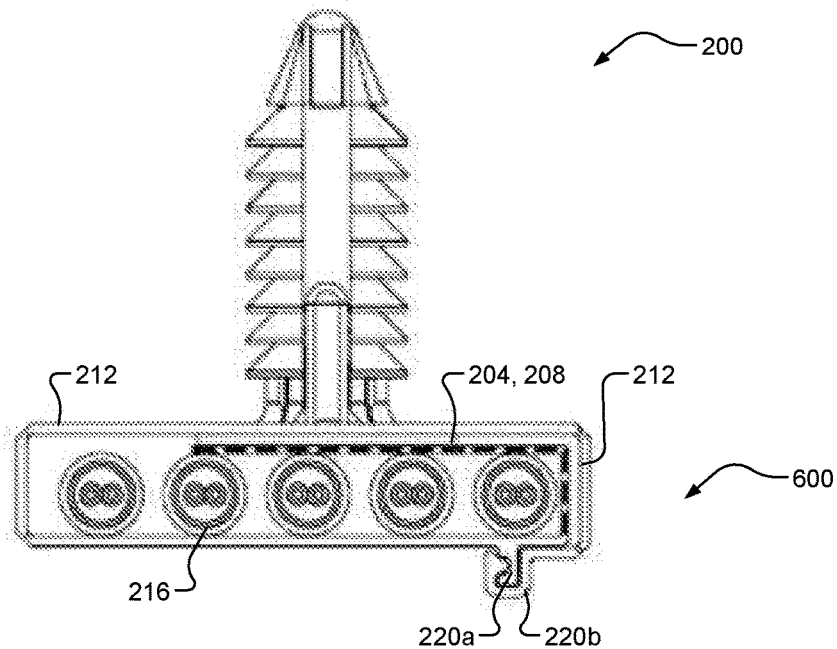

INTEGRATED FLEXIBLE PRINTED CIRCUIT WITH ROUTING CHANNEL/AID

CROSS-REFERENCE TO RELATED APPLICATION(S)

The present application claims the benefit of U.S. Provisional Application No. 62/962,621, filed on Jan. 17, 2020. The disclosure of this application is incorporated herein by reference in its entirety.

FIELD

The present disclosure generally relates to automotive electrical systems and, more particularly, to improved flexible circuits (FCs) having an integrated routing channel/aid.

BACKGROUND

A flexible circuit (FC) is an electronic circuit formed by mounting electronic elements (e.g., conductive circuit traces) on a flexible substrate. The flexibility of conventional FCs is limited by their materials and their dimensions (e.g., thicknesses). More flexible FCs are desirable for applications having very small or limited packaging space, such as a vehicle (and in particular, an autonomous electrified vehicle). Routing and packaging of these flexible FCs therefore requires a complex, optimized installation configuration. Determining and executing these complex installation configurations, however, can be difficult and time consuming, both for human and robotic installers. Accordingly, while conventional FCs work well for their intended purpose, an opportunity exists for improvement in the art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a flexible circuit (FC) is presented. In one exemplary implementation, the FC comprises: a primary dielectric layer having a plurality of substantially parallel conductive circuit traces disposed therein and a secondary dielectric layer extending from or attached to the primary dielectric layer, wherein the secondary dielectric layer does not have any conductive circuit traces disposed therein, wherein at least one of the primary and secondary dielectric layers defines an alignment feature for wrapping and securing the FC about a central structure.

In some implementations, the central structure comprises a coaxial cable. In some implementations, the alignment feature is an adhesive-based fold-over tab at an end of the secondary dielectric layer.

In some implementations, the alignment feature is complimentary first and second interlocking tabs, wherein the first interlocking tab is arranged proximate to a point between the primary and secondary dielectric layers and the second interlocking tab is arranged proximate to an opposing and of the secondary dielectric layer.

In some implementations, the alignment feature is an aperture defined in the secondary dielectric layer that is configured to have a securing feature disposed therethrough, wherein the securing feature is configured to be secured to a surface. In some implementations, the surface is a body of a vehicle. In some implementations, the securing feature is a fir tree connector configured to be secured to the body of the vehicle via an aperture defined in the body of the vehicle.

In some implementations, the primary dielectric layer wraps around a portion of the central structure and the secondary dielectric layer wraps around at least a remainder of the central structure. In some implementations, the secondary dielectric layer further wraps around at least a portion of the primary dielectric layer. In some implementations, the secondary dielectric layer wraps around the entire primary dielectric layer.

According to another aspect of the present disclosure, a method of wrapping and securing an FC about a central stricture is presented. In one exemplary implementation, the method comprises: providing a primary dielectric layer of the FC, the primary dielectric layer having a plurality of substantially parallel conductive circuit traces disposed therein, providing a secondary dielectric layer of the FC, the secondary dielectric layer extending from or attached to the primary dielectric layer, wherein the secondary dielectric layer does not have any conductive circuit traces disposed therein, wherein at least one of the primary and secondary dielectric layers defines a set of alignment features for wrapping and securing the FC about a central structure, and wrapping the FC about the central structure while aligning each alignment feature of the set of alignment features with a respective complimentary alignment feature such that the FC fully encompasses the central structure and is secured thereabout.

In some implementations, the central structure comprises a coaxial cable.

In some implementations, one of the set of alignment features is an adhesive-based fold-over tab at an end of the secondary dielectric layer.

In some implementations, two of the set of alignment features are complimentary first and second interlocking tabs, wherein the first interlocking tab is arranged proximate to a point between the primary and secondary dielectric layers and the second interlocking tab is arranged proximate to an opposing and of the secondary dielectric layer.

In some implementations, one of the set of alignment features is an aperture defined in the secondary dielectric layer that is configured to have a securing feature disposed therethrough, wherein the securing feature is configured to be secured to a surface. In some implementations, the surface is a body of a vehicle. In some implementations, the securing feature is a fir tree connector configured to be secured to the body of the vehicle via an aperture defined in the body of the vehicle.

In some implementations, the wrapping of the FC comprises wrapping the primary dielectric layer around a portion of the central structure and wrapping the secondary dielectric layer wraps around at least a remainder of the central structure. In some implementations, the wrapping of the FC further comprises wrapping the secondary dielectric layer further around at least a portion of the primary dielectric layer.

According to yet another aspect of the present disclosure, an FC is presented. In one exemplary implementation, the FC comprises a primary dielectric layer means for having a plurality of substantially parallel conductive circuit trace means s disposed therein, and a secondary dielectric layer means for extending from or attached to the primary dielectric layer means, wherein the secondary dielectric layer means does not have any conductive circuit trace means disposed therein, wherein at least one of the primary and secondary dielectric layer means defines an alignment feature means for wrapping and securing the FC about a central structure means.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2B illustrate perspective and side views of a second example configuration of an FC having a set of alignment features for wrapping and securing the FC according to some implementations of the present disclosure;

FIGS. 3A-3B illustrate perspective and side views of a first step of wrapping and securing the second example configuration of the FC of FIGS. 2A-2B about a set of coaxial cables according to some implementations of the present disclosure;

FIGS. 4A-4B illustrate perspective and side views of a second step of wrapping and securing the second example configuration of the FC of FIGS. 2A-2B and 3A-3B about the set of coaxial cables according to some implementations of the present disclosure;

FIGS. 6A-6B illustrate perspective and side views of a fourth step of wrapping and securing the second example configuration of the FC of FIGS. 2A-2B, 3A-3B, 4A-4B, and 5A-5B about the set of coaxial cables according to some implementations of the present disclosure.

DETAILED DESCRIPTION

Figure 1A:
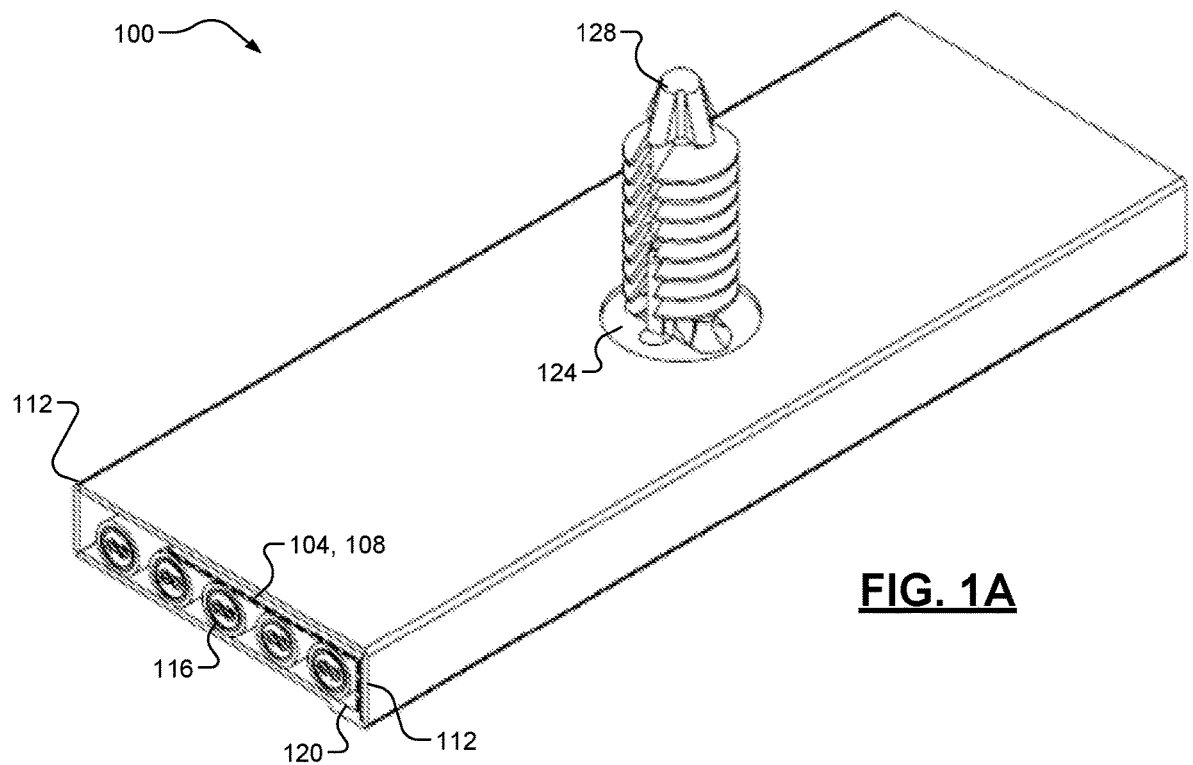
FIGS. 1A-1B illustrate perspective and side views of a first example configuration of a flexible circuit (FC) having a set of alignment features for wrapping and securing the FC about a set of coaxial cables according to some implementations of the present disclosure.
Figure 1B:
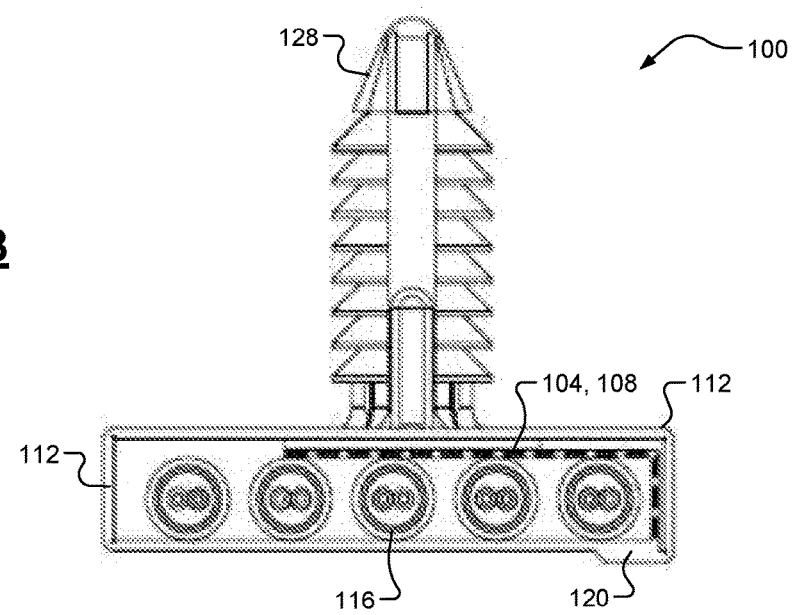

Referring now to FIGS. 1A-1B, a first example configuration of a flexible circuit (FC) 100 according to some implementations of the present disclosure is illustrated. The FC 100 comprises a plurality of distinct (singulated) conductive circuit traces 104 that are substantially parallel to each other. Each conductive circuit trace 104 is formed of a conductive material that should be lightweight and flexible (i.e., non-brittle) material, while also providing good conductive properties. Non-limiting examples of the conductive material include copper and aluminum and conductive inks. The plurality of conductive circuit traces 104 could be applied using any suitable deposition process, including, but not limited to, deposition processes (physical/chemical vapor deposition, sputtering, etc.) and printing processes (screen printing, lithography, inkjet, etc.). While flexible printed circuits (FPCs) are primarily discussed and shown herein, it will be appreciated that the present disclosure is directed to any type of FC. The conductive circuit traces illustrated here have a generally rectangular cross-section, but other embodiments wherein the conductive circuit traces have round, oval, square or other cross-sectional shapes may also be envisioned. A primary dielectric layer 108 has the plurality of conductive circuit traces 104 disposed therein such that the primary dielectric layer 108 supports and insulates (e.g., protects) the plurality of conductive circuit traces 104.

A secondary dielectric layer 112 extends from or is attached to an end of the primary dielectric layer 108 and does not have conductive circuit traces disposed therein. These primary and secondary dielectric layers 108, 112 could be formed using any suitable process, including, but not limited to, injection molding (e.g., multi-shot injection molding) or additive manufacturing processes (e.g. stereolithography, digital light processing, fused deposition modeling, fused filament fabrication, selective laser sintering, selecting heat sintering, multi-jet modeling, multi-jet fusion, electronic beam melting, laminated object manufacturing, and three-dimensional (3D) printing). While single primary and secondary dielectric layers 108, 112 are illustrated, it will be appreciated that the primary dielectric layer 108 and/or the secondary dielectric layer 112 could be collectively formed of a plurality of dielectric sub-layers, which could be formed at different times during processing of the FC 100 and could be made of the same or different materials. Different quantities/types of dielectric sub-layers and/or different channel configurations/shapes and/or depths could be designed and utilized to achieve a desired flexibility of the FC 100. In one embodiment, each dielectric material is an insulating polymer (polyimide, polyamide, polyester, compounds thereof, etc.) that is flexible and non-conductive. For example only, the primary dielectric layer 108 could comprise a first dielectric sub-layer that is initially formed and the plurality of conductive circuit traces 104 could be applied thereto, and then a second dielectric sub-layer could be applied atop both of these to form the primary dielectric layer 108 having the plurality of conductive circuit traces 104 disposed therein.

The FC 100 could also include a plurality of channels extending at least partially through a thickness of the primary dielectric layer 108 and/or the secondary dielectric layer 112 to increase the flexibility of the FC 100 (e.g., in a direction perpendicular to the length of the plurality of conductive circuit traces 104). In one implementation, at least some of the plurality of channels extend fully through a thickness of the primary dielectric layer 108 and/or the secondary dielectric layer 112, thereby forming slots or apertures. The FC 100 defines a set of one or more alignment features for wrapping and securing the FC 100 about a set of one or more coaxial cables 116. As shown, the set of alignment features comprises a fold-over feature 120 and an aperture feature 124. By wrapping and securing the FC 100 about the set of coaxial cables 116, the set of coaxial cables 116 are insulated and protected. In addition, wrapping the FC 100 about the set of coaxial cables 116 saves packaging space and thereby provides for more design and installation flexibility. While a set of coaxial cables 116 are shown, it will be appreciated that the FC 100 could be wrapped around any suitable central structure, such as a single round cable or another box-shaped structure (e.g., an electronic controller or control module). It will be appreciated that the term "wrapping" as used herein refers to FC wrapping, folding, or routing about the central structure to encompass the central structure.

The fold-over feature 120 is at an end of the secondary dielectric layer 112 and connects the secondary dielectric layer 112 to itself, thereby completing at least one full wrap-around of the set of coaxial cables 116 and the primary dielectric layer 108. By wrapping the secondary dielectric layer 112 around and atop of the primary dielectric layer 108, the plurality of conductive circuit traces 104 disposed therein could be further insulated and protected. While shown as a relatively flat tab (e.g., an adhesive-based tab), it will be appreciated that other structural connective features could be utilized (hooks, clips, etc.), as will be described in greater detail below. In one exemplary implementation, an identifier could be defined in a surface of the FC 100 (e.g., a laser-etching in a top/exposed surface of the secondary dielectric layer 112). This identifier could be a barcode, quick response (QR) code, a numerical code, an alphabetical code, an alphanumerical code, or combinations thereof. The identifier could be interpreted or scanned (e.g., by a human installer or by a robotic installer) and its information could be used to identify a type of the FC 100 and/or an installation location for the FC 100.

Referring now to FIGS. 2A-2B, a second example configuration of an FC 200 according to some implementations of the present disclosure is illustrated. The FC 200 comprises a primary dielectric layer 204 having a plurality of substantially parallel conductive traces 208 disposed therein. The FC 200 further comprises a secondary dielectric layer 212 extending from or attached to the primary dielectric layer 204. While shown as being parallel and of substantially the same thickness (e.g., the same dielectric material), it will be appreciated that one of the primary and secondary dielectric layers 204, 212 could be thicker than the other. While shown as a single piece, it will also be appreciated that the secondary dielectric layer 212 could be physically attached or otherwise connected to the primary dielectric layer 212. The FC 200 defines a set of three alignment features: complimentary first and second interlocking tabs 220a, 220b and an aperture 224. In one implementation, the first interlocking tab 220a is arranged proximate to a point between the primary and secondary dielectric layers 204, 212. These first and second interlocking tabs 220a could each be formed of the same dielectric material or could be a separate device attached thereto. The second interlocking tab 220b is arranged proximate to an opposing end of the secondary dielectric layer 212. The second dielectric layer 212 also has the aperture 224 defined therein. While first and second interlocking tab features 220a, 220b are specifically illustrated and described herein, it will be appreciated that the FC 200 could define other types or configurations of alignment features, including, but not limited to, a slot and tab type alignment feature (e.g., single slots and/or tabs or multiple slots and/or tabs) that utilize a close-and-secure alignment/connection method and the like.

Figure 5A:
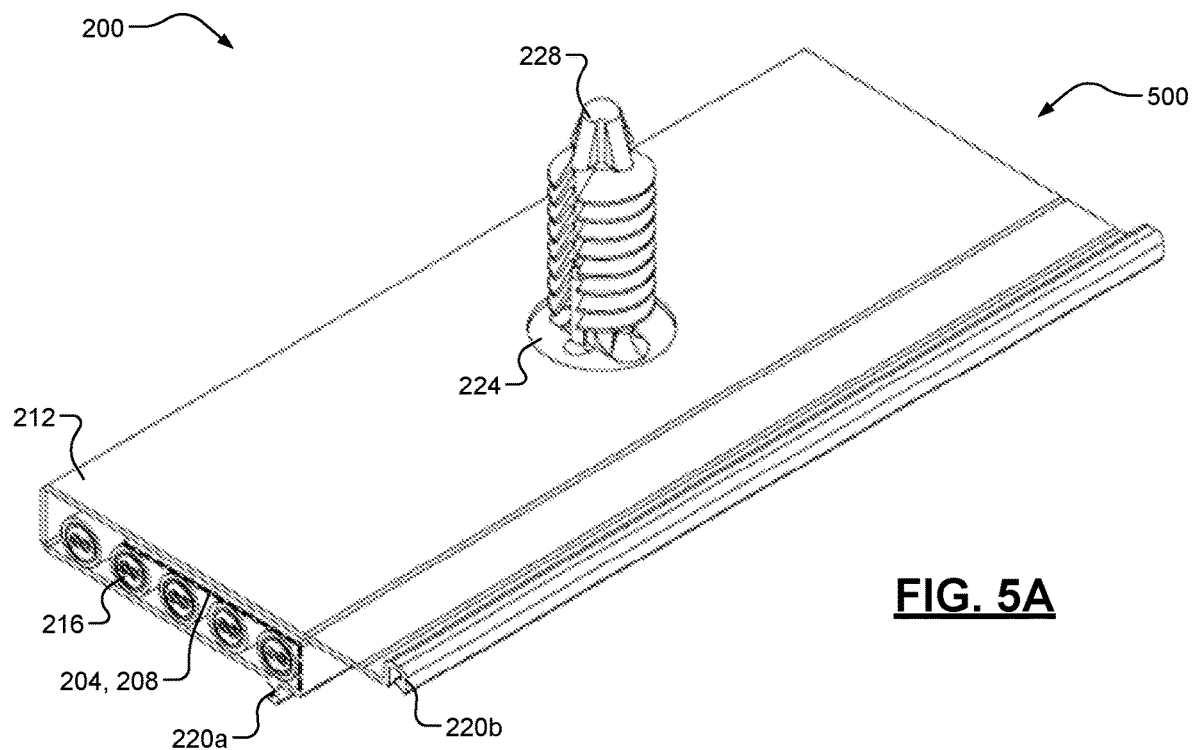
FIGS. 5A-5B illustrate perspective and side views of a third step of wrapping and securing the second example configuration of the FC of FIGS. 2A-2B, 3A-3B, and 4A-4B about the set of coaxial cables according to some implementations of the present disclosure.
Figure 5B:
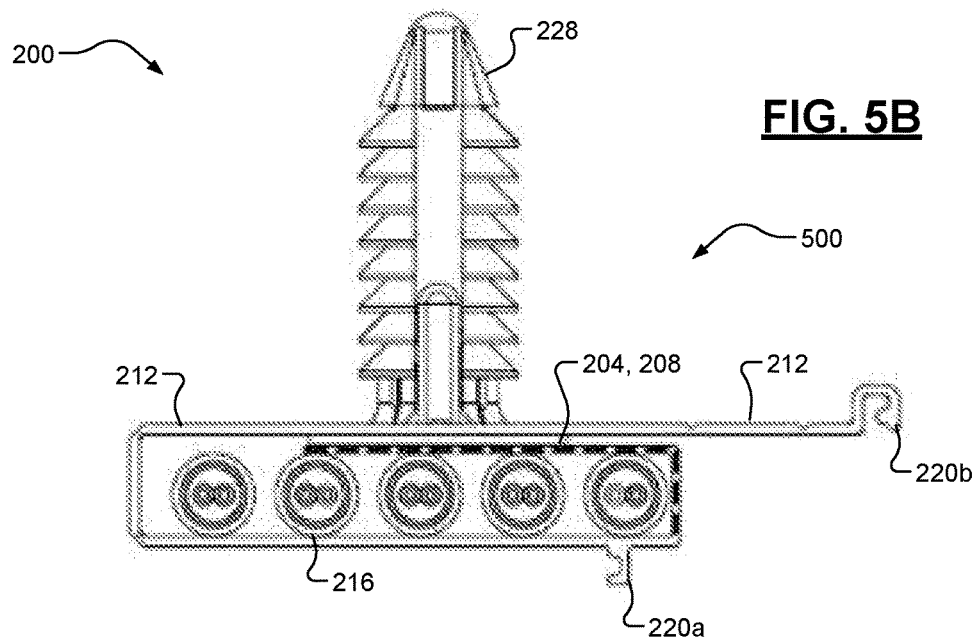

Referring now to FIGS. 3A-3B, 4A-4B, 5A-5B, and 6A-6B, the wrapping or wrapping of the FC 200 about a set of one or more coaxial cables 216 is illustrated. In FIGS. 3A-3B, a first step 300 of wrapping and securing the FC 200 is illustrated. As shown, the primary dielectric layer 204 is wrapped around a fifth/last coaxial cable 216 and back to a second coaxial cable 216 such that the first interlocking tab 220a is below the fifth/last coaxial cable 216. In FIGS. 4A-4B, a second step 400 of wrapping and securing the FC 200 is illustrated. As shown, a securing feature 228 is permanently or temporarily affixed atop the primary dielectric layer 204 or the securing feature 228 is merely positioned in this location until later steps. While the securing feature 228 is shown to be a tree clip or connector (e.g., a Christmas or fir tree style connector), it will be appreciated that any suitable securing feature could be utilized to secure to a surface (e.g., a slot(s)/tab(s) type close-and-secure configuration, as described above). For example only, the securing feature 228 could be secured to a body of a vehicle via an aperture in the body. In this second step 400, the secondary dielectric layer 212 has also been wrapped around the first coaxial cable 216 such that the secondary dielectric layer 212 is extending vertically. In FIGS. 5A-5B, a third step 500 of wrapping and securing the FC 200 is illustrated. As shown, the vertically-extended portion of the secondary dielectric layer 212 has been folded over such that the securing feature 228 is aligned through aperture 224 such that its wide, circular shaped end is sandwiched between the primary and secondary dielectric layers 204, 212.

Lastly, in FIGS. 6A-6B, a fourth step 600 or wrapping and securing the FC 200 is illustrated. As shown, the remaining portion of the secondary dielectric layer 212 is folded over the remainder of the primary dielectric layer 204 and the complimentary first and second interlocking tabs 220a, 220b are engaged with each other to fully secure the FC 200 about the set of coaxial cables 216. This provides for a full encompassing of both the set of coaxial cables 216 as well as the primary dielectric layer 204 (with the plurality of conductive traces 208 disposed therein). This provides for shielding/protection of the components within, as well as decreased packaging size/space. In addition, the attachment to the securing feature 228 allows for the FC 200 and the set of coaxial cables 216 to be attached or secured to a surface via the securing feature 228. As previously mentioned, this securing feature 228 could be inserted into an aperture in a body of a vehicle, thereby allowing for a secure and compact installation by either a human installer or a robotic installer.

Figure 7:
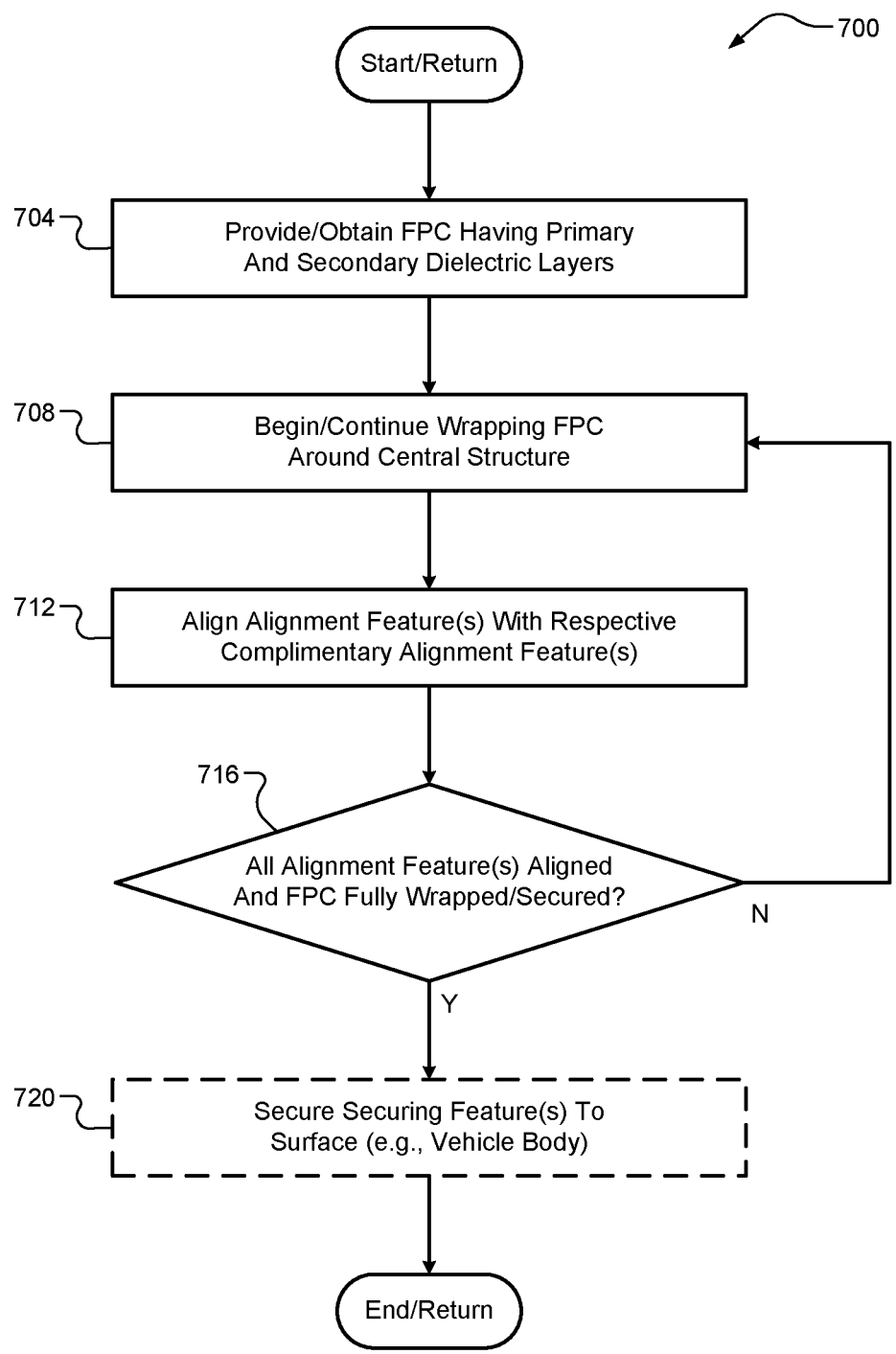
FIG. 7 illustrates a flow diagram of a method of wrapping and securing an FC having a set of alignment features according to some implementations of the present disclosure.

Referring now to FIG. 7, a flow diagram of a method 700 of wrapping and securing an FC (e.g., FC 100 or 200) about a central stricture is illustrated. While the components/features of FC 200 of FIGS. 2A-6B will be specifically referenced, it will be appreciated that method 700 could be applicable to any suitable FC (e.g., FC 100). At step 704, the FC 200 is provided or obtained. At step 708, wrapping of the FC 200 about a central structure (e.g., coaxial cable(s) 216) begins or continues. At step 712, each alignment feature of the set of alignment features is aligned with respective complimentary alignment features (aperture 224 with securing feature 228, second interlocking tab 220b with first interlocking tab 220a, etc.). While shown as separate steps, it will be appreciated that these steps 708, 712 could occur simultaneously or at least partially overlapping in time. At step 716, it is determined whether the FC 200 has been fully wrapped about the central structure and whether there all of the alignment features have been aligned. When false, the method 700 returns to step 708 and the process continues. When true, however, the method 700 ends or returns to step 704. Optionally, the method 700 could proceed to optional step 720 where the securing feature 228 is secured to a surface (e.g., a body of a vehicle), after which the method 700 then ends or returns to step 704.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, the term module may refer to, be part of, or include: an Application Specific Integrated Circuit (ASIC); an electronic circuit; a combinational logic circuit; a field programmable gate array (FPGA); a processor or a distributed network of processors (shared, dedicated, or grouped) and storage in networked clusters or datacenters that executes code or a process; other suitable components that provide the described functionality; or a combination of some or all of the above, such as in a system-on-chip. The term module may also include memory (shared, dedicated, or grouped) that stores code executed by the one or more processors.

The term code, as used above, may include software, firmware, byte-code and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein, and any references to specific languages are provided for disclosure of enablement and best mode of the present invention.

The present disclosure is well suited to a wide variety of computer network systems over numerous topologies. Within this field, the configuration and management of large networks comprise storage devices and computers that are communicatively coupled to dissimilar computers and storage devices over a network, such as the Internet.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electrical system for secure installation in a vehicle, the electrical system comprising:
   a set of coaxial cables;
   a flexible circuit (FC) configured to be wrapped around the set of coaxial cables thereby securing the set of coaxial cables within, the FC comprising:
      a primary dielectric layer having a plurality of substantially parallel conductive circuit traces disposed therein, and
      a secondary dielectric layer extending from or attached to the primary dielectric layer and defining a first aperture, wherein the secondary dielectric layer does not have any conductive circuit traces disposed therein,
      wherein at least one of the primary and secondary dielectric layers defines an alignment feature for securing the FC wrapped around the set of coaxial cables; and
   a physical connector positioned to contact to at least one of the primary and secondary dielectric layers and configured to be inserted through the first aperture for further securing the FC wrapped around the set of coaxial cables,
   wherein the physical connector is further configured to be inserted into a second aperture defined in a body surface of the vehicle to secure the electrical system to the body surface of the vehicle.

2. The electrical system of claim 1, wherein the alignment feature comprises an adhesive-based fold-over tab at an end of the secondary dielectric layer.

3. The electrical system of claim 1, wherein the alignment feature comprises complimentary first and second interlocking tabs, wherein the first interlocking tab is arranged proximate to a point between the primary and secondary dielectric layers and the second interlocking tab is arranged proximate to an opposing end of the secondary dielectric layer.

4. The electrical system of claim 1, wherein the alignment feature comprises the first aperture.

5. The electrical system of claim 1, wherein the physical connector is a fir tree connector.

6. The electrical system of claim 1, wherein the primary dielectric layer wraps around a portion of the set of coaxial cables and the secondary dielectric layer wraps around at least a remainder of the set of coaxial cables.

7. The electrical system of claim 6, wherein the secondary dielectric layer further wraps around at least a portion of the primary dielectric layer.

8. The electrical system of claim 7, wherein the secondary dielectric layer wraps around the entire primary dielectric layer.

9. The electrical system of claim 1, wherein the physical connector is attached or affixed to at least one of the primary and secondary dielectric layers.

10. A method of providing an electrical system for secure installation in a vehicle, the method comprising:
    providing a set of coaxial cables;
    providing a flexible circuit (FC) wrapped around the set of coaxial cables thereby securing the set of coaxial cables within, the FC comprising:
       a primary dielectric layer having a plurality of substantially parallel conductive circuit traces disposed therein, and
       a secondary dielectric layer extending from or attached to the primary dielectric layer and defining a first aperture, wherein the secondary dielectric layer does not have any conductive circuit traces disposed therein,
       wherein at least one of the primary and secondary dielectric layers defines a set of alignment features for securing the FC wrapped around the set of coaxial cables;
    providing a physical connector positioned to contact to at least one of the primary and secondary dielectric layers and inserted through the first aperture for further securing the FC wrapped around the set of coaxial cables; and
    inserting the physical connector into a second aperture defined in a body surface of the vehicle to secure the electrical system to the body surface of the vehicle.

11. The method of claim 10, wherein one of the set of alignment features is an adhesive-based fold-over tab at an end of the secondary dielectric layer.

12. The method of claim 10, wherein two of the set of alignment features are complimentary first and second interlocking tabs, wherein the first interlocking tab is arranged proximate to a point between the primary and secondary dielectric layers and the second interlocking tab is arranged proximate to an opposing end of the secondary dielectric layer.

13. The method of claim 10, wherein one of the set of alignment features is the first aperture.

14. The method of claim 10, wherein the physical connector is a fir tree connector.

15. The method of claim 10, further comprising wrapping the primary dielectric layer around a portion of the set of coaxial cables and wrapping the secondary dielectric layer around at least a remainder of the set of coaxial cables.

16. The method of claim 15, further comprising wrapping the secondary dielectric layer further around at least a portion of the primary dielectric layer.

17. The method of claim 10, wherein the physical connector is attached or affixed to at least one of the primary and secondary dielectric layers.

18. An electrical system for secure installation in a vehicle, the electrical system comprising:
    a set of coaxial cable means;
    a flexible circuit (FC) means for wrapping around the set of coaxial cable means thereby securing the set of coaxial cable means within, the FC means comprising:
       a primary dielectric layer means for having a plurality of substantially parallel conductive circuit trace means disposed therein, and
       a secondary dielectric layer means for extending from or attached to the primary dielectric layer means and defining a first aperture, wherein the secondary dielectric layer means does not have any conductive circuit trace means disposed therein,
       wherein at least one of the primary and secondary dielectric layer means defines an alignment feature means for securing the FC means wrapped around the set of coaxial cable means; and a physical connector means positioned to contact to at least one of the primary and secondary dielectric layer means and for insertion through the first aperture for further securing the FC means wrapped around the set of coaxial cable means, wherein the physical connector means is further for insertion into a second aperture defined in a body surface of the vehicle to secure the electrical system to the body surface of the vehicle.

19. The electrical system of claim 18, wherein the physical connector means is attached or affixed to at least one of the primary and secondary dielectric layer means.

* * * * *